(12) United States Patent
Yamamoto et al.

(10) Patent No.: US 10,697,079 B2
(45) Date of Patent: Jun. 30, 2020

(54) PLATING DEVICE

(71) Applicant: YAMAMOTO-MS Co., Ltd., Tokyo (JP)

(72) Inventors: Wataru Yamamoto, Tokyo (JP);
Katsunori Akiyama, Tokyo (JP);
Chikako Suzuki, Tokyo (JP);
Masazumi Ishiguro, Tokyo (JP)

(73) Assignee: Yamamoto-MS Co., Ltd., Tokyo (JP)

(*) Notice: Subject to any disclaimer, the term of this patent is extended or adjusted under 35 U.S.C. 154(b) by 0 days.

(21) Appl. No.: 16/065,503

(22) PCT Filed: Dec. 20, 2016

(86) PCT No.: PCT/JP2016/087860
§ 371 (c)(1),
(2) Date: Jun. 22, 2018

(87) PCT Pub. No.: WO2017/110765
PCT Pub. Date: Jun. 29, 2017

(65) Prior Publication Data
US 2019/0003069 A1    Jan. 3, 2019

(30) Foreign Application Priority Data

Dec. 25, 2015    (JP) .................. 2015-254509

(51) Int. Cl.
*C25D 5/08*    (2006.01)
*H01L 21/288*    (2006.01)
(Continued)

(52) U.S. Cl.
CPC .............. *C25D 5/08* (2013.01); *C25D 7/12* (2013.01); *C25D 17/001* (2013.01); *C25D 17/02* (2013.01);
(Continued)

(58) Field of Classification Search
CPC ...... C25C 17/001; C25D 17/001; C25D 5/08; C25D 7/12; C25D 17/02; C25D 17/10; C25D 17/12; C25D 21/10; H01L 21/288
See application file for complete search history.

(56) References Cited

U.S. PATENT DOCUMENTS

2004/0154915 A1*    8/2004    Kovarsky .......... H01L 21/2885
                                              204/237
2005/0040049 A1*    2/2005    Volodarsky ............. C25D 5/08
                                              205/652
(Continued)

FOREIGN PATENT DOCUMENTS

JP    63-094967 U    6/1988
JP    2002-115096 A    4/2002
(Continued)

OTHER PUBLICATIONS

International search report and written opinion received in connection with international application No. PCT/2016/087860, dated Mar. 21, 2017 (with English Translation of the Search Report).
(Continued)

*Primary Examiner* — Ciel P Contreras
(74) *Attorney, Agent, or Firm* — The Marbury Law Group, PLLC

(57) ABSTRACT

A plating device comprising: a water tank into which a plating solution is poured; a tubular nozzle being disposed in the water tank and serving as an anode; a to-be-plated object being disposed in the water tank so as to be opposed to the nozzle and serving as a cathode; a direct-current power source to apply a voltage between the nozzle and the to-be-plated object; and a pump to circulate the plating solution such that the plating solution poured into the water tank passes through the nozzle and is ejected onto the to-be-plated object. A perforated plate member, which includes a through-hole having a smaller diameter than the
(Continued)

inside diameter of the nozzle, is arranged on the inflow side of the nozzle such that the through-hole is opposed to an open region of the nozzle.

8 Claims, 4 Drawing Sheets

(51) Int. Cl.
    *C25D 17/02*     (2006.01)
    *C25D 17/12*     (2006.01)
    *C25D 17/00*     (2006.01)
    *C25D 21/10*     (2006.01)
    *C25D 7/12*     (2006.01)
    *C25D 17/10*     (2006.01)

(52) U.S. Cl.
    CPC .............. *C25D 17/10* (2013.01); *C25D 17/12* (2013.01); *C25D 21/10* (2013.01); *H01L 21/288* (2013.01)

(56) References Cited

U.S. PATENT DOCUMENTS

2008/0202936 A1   8/2008   Jensen et al.
2014/0124361 A1*  5/2014   Reid .................... C25D 17/008
                                              204/227

FOREIGN PATENT DOCUMENTS

JP         2006-052471 A     2/2006
JP         2009-501276 A     1/2009

OTHER PUBLICATIONS

Certificate for Application of Rule of Exception to Lack of Novelty; dated Nov. 9, 2015 (and English translation).
Certificate for Application of Rule of Exception to Lack of Novelty; dated Sep. 15, 2015 (and English translation).
Request for Application of Rule of Exception to Lack of Novelty dated Jan. 22, 2016 (and English translation).

* cited by examiner

PLATING DEVICE

RELATED APPLICATIONS

This application is a U.S. national phase entry of international application no. PCT/JP2016/087860, filed on Dec. 20, 2016, which claims priority to Japanese Application No. 2015-254509, filed Dec. 25, 2015, the entire disclosures of which are incorporated herein by reference in their entireties.

TECHNICAL FIELD

The present invention relates to a plating device which is capable of forming a uniform plated coating on a to-be-plated object.

BACKGROUND ART

In recent years, plating techniques have been applied to various technical fields, and used in a semiconductor wiring technique. In the field of semiconductor, reduction in wiring pitch of a semiconductor device is required in order to achieve higher integration and performance. A method that is frequently used in these days is designed to conduct dry etching in order to form wiring grooves in an oxide film formed on a silicon wafer serving as a to-be-plated object, and to implant a wiring material by plating the grooves.

In the case of actually electroplating a to-be-plated object, a plating solution is poured into a water tank, for instance, and then plating is conducted by ejecting the plating solution from a nozzle on an anode side onto the to-be-plated object on a cathode side. In this case, a metallic ion concentration near the cathode is reduced as a consequence of deposition of metallic ions near the cathode. Accordingly, the plating is conducted by ejecting the new plating solution at high speed from the nozzle onto the to-be-plated object which is the cathode. In this way, a thickness of a plated coating to be formed on a plated surface can be made uniform by homogenizing the metallic ion concentration near the to-be-plated object on the cathode side. A device disclosed in Patent Literature 1 represents the technique of this type.

CITATION LIST

Patent Literature

Patent Literature 1: JP2006-52471A1

SUMMARY OF INVENTION

Technical Problem

However, when the plating solution is ejected at high speed from the nozzle onto the to-be-plated object as mentioned above, the ejected plating solution develops a lot of foam (bubbles) hitting against the plated surface. At the portion of the plated surface hit by the foam, the plating solution is blocked by the foam and hardly hits against this portion. This leads to a problem that the plated surface is likely to bear stains (see FIG. 2B), scorch marks (see FIG. 2C), and the like, which may complicate formation of the uniform plated coating across the entire plated surface.

The present invention has been made in view of the aforementioned circumstances, and an object of the present invention is to provide a plating device which is capable of forming a uniform plated coating on a plated surface of a to-be-plated object.

Solution to Problem

As a solution to the above-mentioned problem, the present invention provides a plating device including a water tank into which a plating solution is poured; a tubular nozzle being disposed in the water tank and serving as an anode; a to-be-plated object being disposed in the water tank so as to be opposed to the nozzle and serving as a cathode; a direct-current power source to apply a voltage between the nozzle and the to-be-plated object; and a pump to circulate the plating solution such that the plating solution poured into the water tank passes through the nozzle and is ejected onto the to-be-plated object. The plating device is characterized in that the device further includes an opening restricting unit to restrict an opening on an inflow side of the nozzle to a smaller diameter than an inside diameter of the nozzle.

Advantageous Effects of Invention

According to the present invention, it is possible to provide a plating device which is capable of forming a uniform plated coating on a plated surface of a to-be-plated object.

DESCRIPTION OF EMBODIMENT

An embodiment of the present invention will be described below with reference to the accompanying drawings.

Configuration of Embodiment

Figure 1:
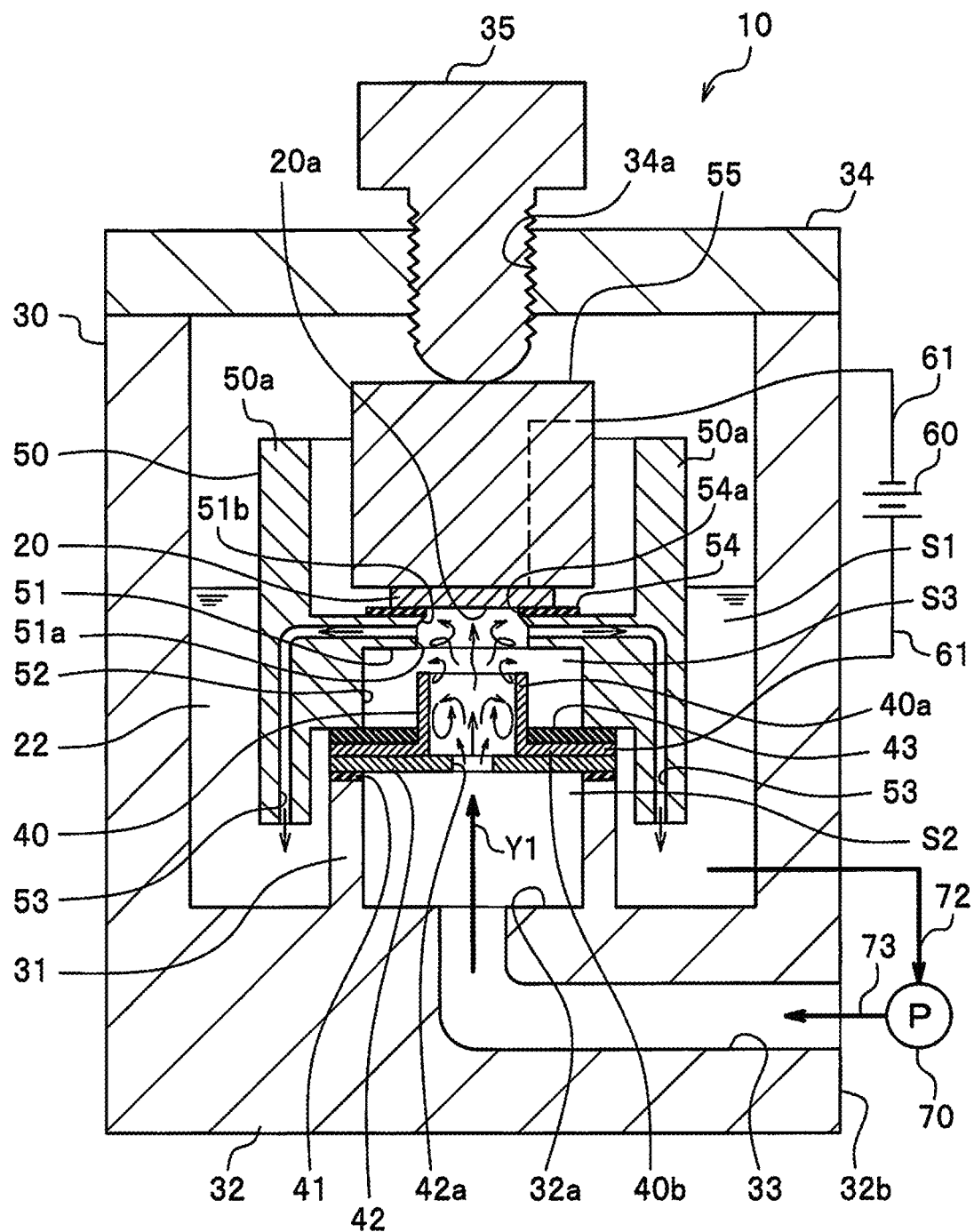
FIG. 1 is a longitudinal sectional view showing a configuration of a plating device according to an embodiment of the present invention.

FIG. 1 is a longitudinal sectional view showing a configuration of a plating device according to an embodiment of the present invention.

A plating device 10 shown in FIG. 1 forms a uniform plated coating (see 22a in FIG. 2A) on a plated surface 20a of a to-be-plated object 20 such as a silicon wafer. In terms of broad categorization, the plating device 10 includes a water tank 30, a nozzle section 40, a to-be-plated object setting section 50, a direct-current power source (a power source) 60, and a pump 70.

The water tank 30 is made of a resin material such as transparent acrylic resin and formed into a rectangular parallelepiped shape as a whole. A nozzle fixing section 31 having a shape of a square tube projecting upward is provided on a bottom surface inside the rectangular parallelepiped shape. Meanwhile, a bottom surface section 32 of the water tank 30 has a predetermined thickness, and the bottom surface section 32 is provided with a flow passage 33 that penetrates a portion between a bottom surface 32a and an outer side surface 32b while forming an L-shape. An opening of the flow passage 33 opened to the bottom surface 32a is located inside the square tube of the nozzle fixing section 31. While the nozzle fixing section 31 is described to have the shape of the square tube in this embodiment, the nozzle fixing section 31 may have other shapes such as a cylindrical shape.

Furthermore, a lid 34 in a shape of a rectangular plate is mounted on upper opening of the water tank 30. This lid 34 is fitted on by use of a fixture (not shown) such as a hinge so as to be able to open and close the upper opening. Thus, the lid 34 can lock the upper opening in a closed state. A screw hole 34a is formed in a penetrating manner at a central part of the lid 34, and a press screw 35 is threadedly engaged with the screw hole 34a. While the press screw 35 is employed in this embodiment, a plunger incorporating a spring may be used instead of the press screw 35 so as to enable application of a certain pressure just by closing the lid 34.

The nozzle section 40 is made of a metallic member and formed into a hat-like shape. The nozzle section 40 includes a nozzle 40a in a cylindrical shape, and a surrounding flat surface portion 40b in a square frame shape that spreads into a square shape horizontally and projects from a lower end opening edge of the nozzle 40a. In this nozzle section 40, the surrounding flat surface portion 40b is placed on and fixed to an upper end surface of the nozzle fixing section 31 of the water tank 30 through a packing 41 and a perforated plate member 42 each in a square frame shape. Note that the perforated plate member 42 constitutes an opening restricting unit as defined in the claims. In addition, when the nozzle fixing section 31 has a cylindrical shape as mentioned above, each of the surrounding flat surface portion 40b of the nozzle section 40, the packing 41, and the perforated plate member 42 is formed into a shape of an annular frame.

The packing 41 is formed into the same square frame shape as that of the upper end surface of the nozzle fixing section 31 by using an elastic material such as silicone rubber.

The perforated plate member 42 is formed by using a solid member such as a glass epoxy board having the same external size as an external size of the nozzle fixing section 31 having the shape of the square tube, and a through-hole 42a smaller than an inside diameter of the nozzle 40a is formed at a central part thereof. A diameter of the through-hole 42a is around $\phi 8$ mm when an opening size of the nozzle 40a is around $\phi 15$ mm, for instance. As described later, the diameter size of the through-hole 42a may be such a size that a plating solution 22 can establish a state of turbulence inside the nozzle 40a when the plating solution 22 passes through the through-hole 42a at a prescribed velocity.

An insulating member 43 having the same shape of the square frame as that of the surrounding flat surface portion 40b of the nozzle section 40 is placed on and fixed to the surrounding flat surface portion 40b. The to-be-plated object setting section 50 is placed on and fixed to the insulating member 43.

The to-be-plated object setting section (a setting section) 50 is formed into a square shape and provided with a partition wall portion 51 that partitions an internal space of its square tube portion 50a in a shape of a square tube into upper and lower subspaces. The partition wall portion 51 is provided orthogonally to a vertical opening direction of the square tube portion 50a. A square-shaped through-hole 51a is formed at a central part of the partition wall portion 51. A size of a diagonal line of this through hole 51a is approximately equal to the inside diameter of the nozzle 40a. Meanwhile, an edge of the through-hole 51a on the to-be-plated object 20 side is formed into a tapered cross-sectional form 51b, which is tapered from the plated surface 20a side toward an inlet of each L-shaped flow passage 53. Meanwhile, an opening of the tapered cross-sectional form 51b has a size corresponding to the plated surface 20a.

In the meantime, on a lower side of the partition wall portion 51, a surrounding projection 52 in a square frame shape, which projects so as to spread square from an inner peripheral surface of the square tube portion 50a to the center, is provided integrally with a lower surface of the partition wall portion 51. An internal space defined by being surrounded in a shape of a square frame by the surrounding projection 52 has a size that can house the nozzle 40a.

An open end of the internal space of the surrounding projection 52 has a size which is approximately the same as that of an end surface of the nozzle fixing section 31 in the shape of the square tube, so that the lower surface of the surrounding projection 52 can be placed on an upper surface of the insulating member 43. In other words, the surrounding projection 52 is placed on the nozzle fixing section 31 of the water tank 30 through the insulating member 43 on the lower side, the surrounding flat surface portion 40b of the nozzle section 40, the perforated plate member 42, and the packing 41. Thus, the setting section 50 is disposed at a predetermined position in the water tank 30.

In the square tube portion 50a and the partition wall portion 51 of the setting section 50, there are formed the L-shaped flow passages 53 each of which has an L-shaped cross section that penetrates from an inner peripheral surface of the through-hole 51a to the inside of the wall of the partition wall portion 51 horizontally outward, and then penetrates the inside of the wall of the square tube portion 50a downward and perpendicularly to the horizontal penetrating direction. Although two L-shaped flow passages 53 are formed opposite from each other in FIG. 1, one or more than two L-shaped flow passages 53 may be formed instead. Here, each flow passage diameter can be formed into any size. Note that each L-shaped flow passage 53 constitutes a bent flow passage as defined in the claims.

A mask member 54 is placed on and fixed to an upper surface of the partition wall portion 51. The mask member 54 is provided with a plating formation hole (a hole) 54a pierced in the same size as that the opening of the tapered cross-sectional form 51b of the partition wall portion 51. The mask member 54 covers the to-be-plated object 20 by using a portion other than the hole 54a, and to plate the plated surface 20a exposed from the hole 54a. Here, the plating formation hole 54a may have a smaller size than the through-hole 51a in the partition wall portion 51. Meanwhile, the mask member 54 has such a size that can entirely cover the to-be-plated object 20 except the portion exposed from the hole 54a.

A cathode-equipped pressing portion (a pressing portion) 55 is placed on the to-be-plated object 20 that is placed on the mask member 54. The pressing portion 55 is formed into either a rectangular parallelepiped shape or a columnar shape, into which a conductive wire 61 connected to a negative electrode of the power source 60 is inserted. The conductive wire 61 passes through the pressing portion 55 and is connected to a not-illustrated electrode on a lower surface thereof. The electrode comes into contact electrically with the to-be-plated object 20. In the meantime, a positive electrode of the power source 60 is connected to the surrounding flat surface portion 40b of the nozzle section 40 through the conductive wire 61.

Figure 2A:
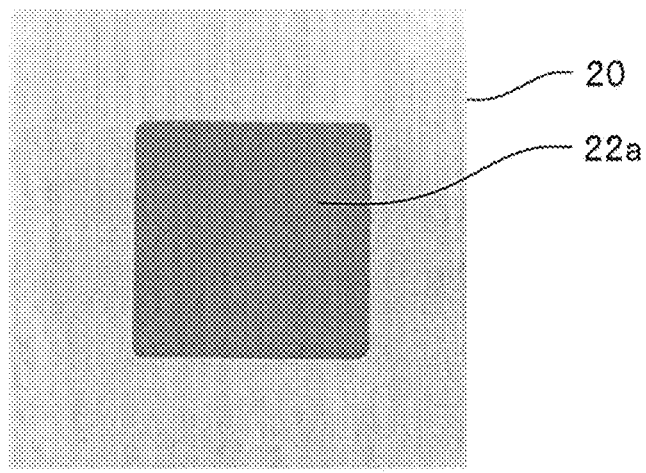
FIG. 2A is a view showing a state in which a plated coating is uniformly formed on a plated surface of a to-be-plated object.

When a voltage is applied from the power source 60 to the nozzle section 40 on the anode side and the to-be-plated object 20 on the cathode side, a current flows in the plating solution 22 that contains positive ions such as copper ions. Hence, a reduction reaction takes place on the plated surface 20a of the to-be-plated object 20 on the cathode side, whereby the metal in the plating solution 22 is deposited and the plated coating 22a grows on the plated surface 20a as shown in FIG. 2A. In the meantime, an anodic dissolution reaction takes place on the nozzle section 40 on the anode side shown in FIG. 1 so as to supply the plating metal ions into the plating solution.

The press screw 35 threadedly engaged with the lid 34 is disposed above the pressing portion 55. By turning the press screw 35 clockwise (to the right), the press screw 35 moves down and presses the pressing portion 55 downward. This pressing action makes it possible to fix the respective components (to be described below) located on the lower side of the pressing portion 55 against the nozzle fixing section 31 of the water tank 30 in a watertight manner. The respective components include, from top to bottom, the to-be-plated object 20, the mask member 54, the partition wall portion 51 as well as the surrounding projection 52 of the setting section 50, the insulating member 43, the surrounding flat surface portion 40b of the nozzle section 40, the perforated plate member 42, and the packing 41.

In the above-described state of fixation with the pressing portion 55, a first space S1 on an outer peripheral side of both the square tube portion 50a of the setting section 50 and the nozzle fixing section 31, and a second space S2 on a lower side as well as a third space S3 on an upper side while using the nozzle section 40 as a boundary therebetween are separated from one another. Note that each of the first to third spaces S1 to S3 is either a reservoir portion or a passage portion for the plating solution 22. Meanwhile, the second space S2 and the third space S3 communicate with each other via the through-hole 42a in the perforated plate member 42, and the third space S3 and the first space S1 communicate with each other via the multiple L-shaped flow passages 53. Moreover, the first space S1 and the second space S2 communicate with each other via pipes 72 and 73 indicated with arrows that pass through the pump 70, and via the flow passage 33.

The pump 70 establishes circulation so as to cause the plating solution 22 stored in the first space S1 at the time of activation to flow to the second space S2 via the pipes 72 and 73 as well as the flow passage 33 as indicated with an arrow Y1, then to flow from the second space S2 to the third space S3 via the through-hole 42a and the nozzle 40a, and further to flow from the third space S3 to the first space S1. Here, at the time of circulation, the volume of the poured plating solution 22 is adjusted so as not to exceed an upper end of the square tube portion 50a of the first space S1.

Operation of Embodiment

Next, a description will be given of an operation in the case of plating the to-be-plated object 20 by using the plating device 10 of this embodiment. As for preconditions, it is assumed that the plating device 10 is assembled as illustrated in FIG. 1, in which the to-be-plated object 20 is set and a required amount of the plating solution 22 is stored.

First, the pump 70 is activated and the power source 60 is turned on after the plating solution 22 starts flowing. Thus, the plating solution 22 stored in the first space S1 flows to the second space S2 via the pipes 72 and 73 as well as the flow passage 33 as indicated with the arrow Y1. The flowing plating solution 22 further hits against the perforated plate member 42 in the second space S2, and part of the plating solution 22 passes through the through-hole 42a and flows to the nozzle 40a thereabove. In this instance, the plating solution 22 passes through the through-hole 42a having the small diameter and flows into the nozzle 40a having the inner peripheral diameter larger than the aforementioned diameter. As a consequence, the plating solution 22 spreads in a direction toward the inner peripheral surface and creates turbulence in the nozzle 40a. The plating solution 22 in the state of turbulence is ejected from the nozzle 40a and hits against the plated surface 20a of the to-be-plated object 20 located thereabove.

Figure 3:
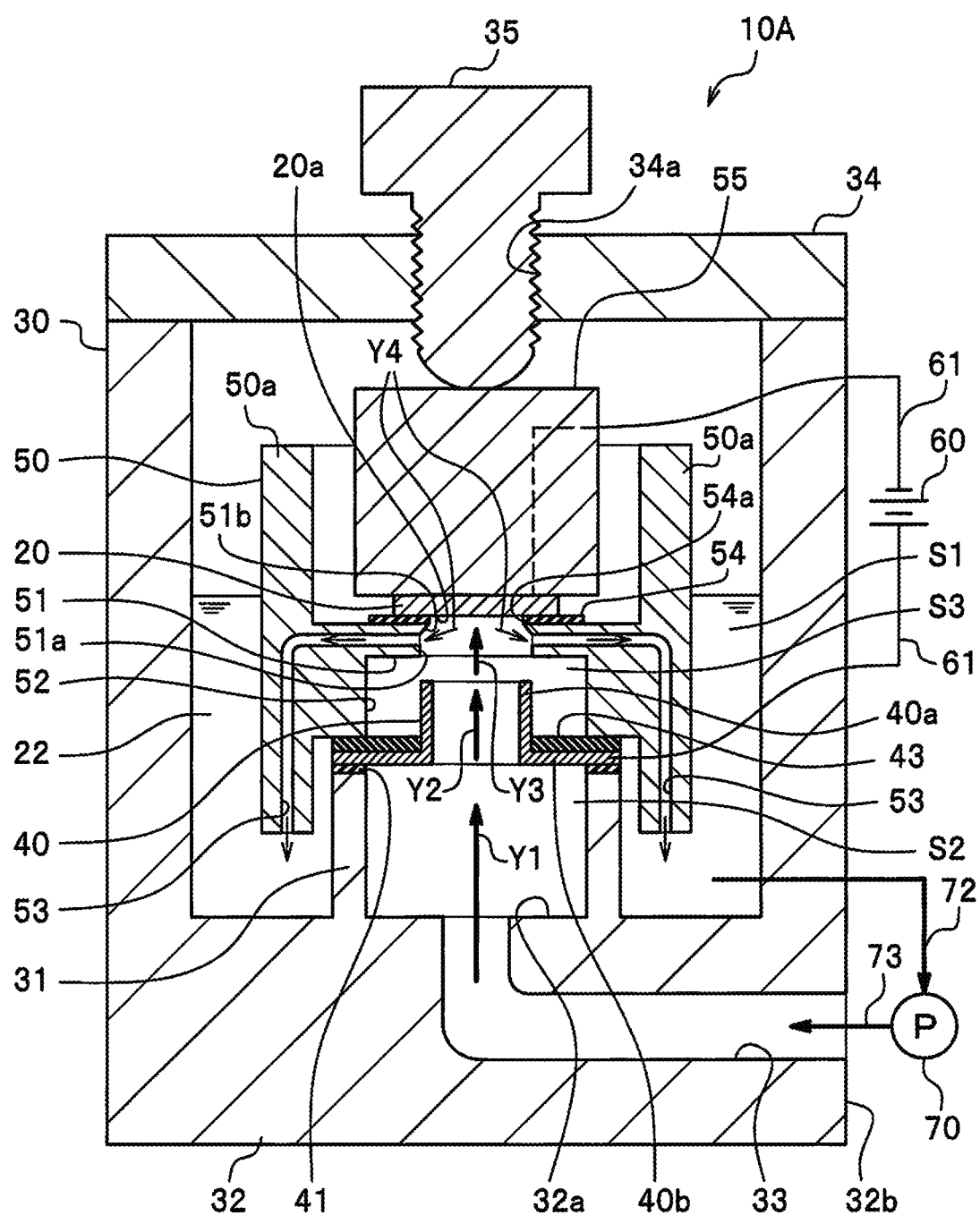
FIG. 3 is a longitudinal sectional view showing a configuration of a plating device of a comparative example.

Here, FIG. 3 shows a plating device 10A representing a comparative example, which is not provided with the perforated plate member 42 (FIG. 1). A state of passage of the plating solution 22 through the nozzle 40a in this plating device 10A will be described. In the plating device 10A, the plating solution 22 having flowed from the flow passage 33 to the second space S2 as indicated with the arrow Y1 by the activation of the pump 70 further flows from an inlet of the nozzle 40a and is ejected from an outlet thereof as indicated with an arrow Y2. The ejected plating solution 22 hits against the plated surface 20a as indicated with an arrow Y3, and then flows outward along the plated surface 20a as indicated with arrows Y4.

That is to say, in the plating device 10A, the inlet and the outlet of the nozzle 40a have the same diameter. Accordingly, the plating solution 22 that flows in from the inlet of the nozzle 40a and is ejected from the outlet thereof is a laminar flow as indicated with the arrows Y1, Y2, and Y3. For this reason, the plating solution 22 is more likely to hit against a portion around the center of the plated surface 20a, and less likely to hit against corner portions thereof. As a consequence, the foam is apt to adhere to the corner portions.

Figure 2B:
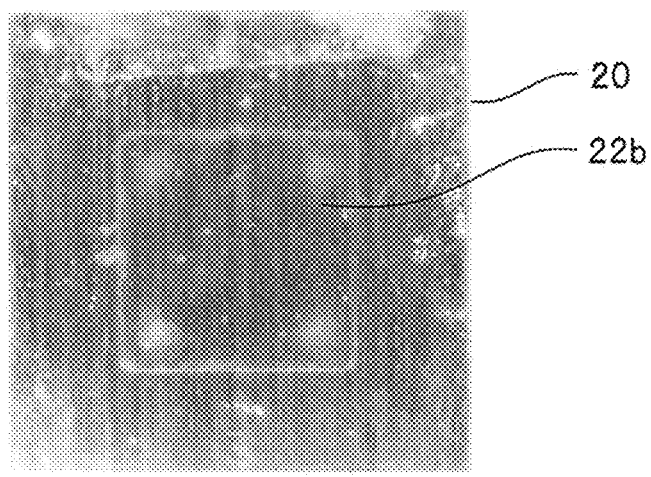
FIG. 2B is a view showing a state in which stains develop on four corners of a plated surface of a to-be-plated object.
Figure 2C:
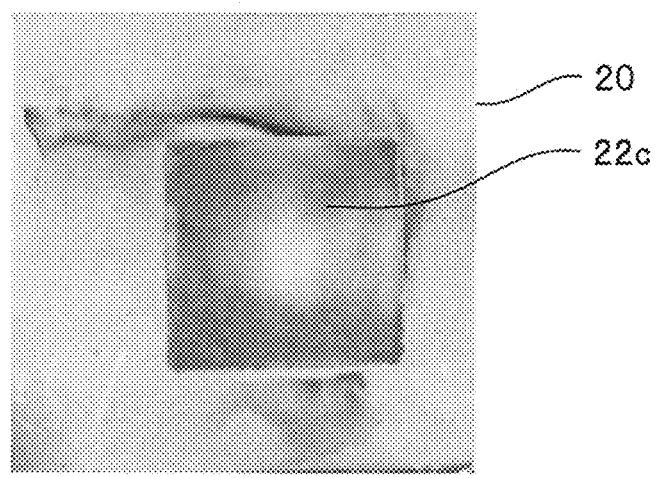
FIG. 2C is a view showing a state in which scorch marks develop on a plated surface of a to-be-plated object.

In other words, when the plating solution 22 hits against the plated surface 20a and flows outward along the plated surface 20a as indicated with the arrows Y4, the foam is apt to stay at four corners at a boundary between the plated surface 20a and the square-shaped through hole 51a. The plating solution 22 is less likely to hit against the portions where the foam stays. For this reason, the stains may develop on four corners of a plated coating 22b as shown in FIG. 2B or the scorch marks may develop on a plated coating 22c as shown in FIG. 2C.

Here, the plated coating 22a shown in FIG. 2A is based on conditions that the inside diameter of the nozzle 40a shown in FIG. 1 is set to ϕ14.9 mm and the diameter of the through-hole 42a of the perforated plate member 42 is set to ϕ8 mm. The plated coating 22b shown in FIG. 2B is based on a condition that the inside diameter of the nozzle is set to ϕ7 mm (without the perforated plate member 42). The plated coating 22c shown in FIG. 2C is based on a condition that the inside diameter of the nozzle 40a shown in FIG. 3 is set to ϕ14.9 mm (without the perforated plate member 42). Other conditions (current values, compositions of the plating solutions, and the like) are the same among the plated coatings 22a to 22c.

On the other hand, in the plating device 10 of the embodiment shown in FIG. 1, the plating solution 22 that flows from the through-hole 42a in the perforated plate member 42 to the nozzle 40a creates the turbulence. This turbulence improves a performance to remove the foam adhering to the plated surface 20a of the to-be-plated object 20 whereby the new plating solution 22 is evenly supplied to the entire plated surface 20a.

In this instance, the current corresponding to the application of the voltage from the power source 60 to the nozzle section 40 on the anode side and the to-be-plated object 20 on the cathode side flows in the plating solution 22. For this reason, the reduction reaction takes place on the plated surface 20a of the to-be-plated object 20 on the cathode side, whereby the metal in the plating solution 22 is deposited and the plated coating 22a grows on the plated surface 20a. In this event, the plating solution 22 evenly hits against the entire plated surface 20a as mentioned above, and the plated coating 22a grows uniformly as shown in FIG. 2A.

Meanwhile, the plating solution 22 after hitting against the plated surface 20a passes through the multiple L-shaped flow passages 53 and flows to the first space S1. Furthermore, the plating solution 22 repeats the circulation including the flow from the first space S1 to the second space S2 similarly.

Effects of Embodiment

As described above, the plating device 10 of this embodiment includes the water tank 30 into which the plating solution 22 is poured, the nozzle section 40 including the tubular nozzle 40a being disposed in the water tank 30 and serving as the anode, the to-be-plated object 20 being disposed in the water tank 30 so as to be opposed to the nozzle section 40 and serving as the cathode, the direct-current power source 60 to apply the voltage between the nozzle section 40 and the to-be-plated object 20, and the pump 70 to circulate the plating solution 22 such that the plating solution 22 poured into the water tank 30 passes through the nozzle 40a and is ejected onto the to-be-plated object 20.

This embodiment is characterized in that the perforated plate member 42 (the opening restricting unit) provided with the through-hole 42a having the smaller diameter than the inside diameter of the nozzle 40a is arranged on an inflow side of the nozzle section 40 such that the through-hole 42a is opposed to an open region of the nozzle 40a.

This configuration can achieve the following effects. That is, the plating solution 22 that flows from the through-hole 42a in the perforated plate member 42 to the nozzle 40a creates the turbulence. This turbulence improves the performance to remove the foam adhering to the plated surface 20a of the to-be-plated object 20 whereby the new plating solution 22 is evenly supplied to the entire plated surface 20a. As a consequence, the plated coating 22a can grow uniformly on the entire plated surface 20a.

Meanwhile, the L-shaped flow passages 53 (the bent flow passages) are each provided in such a way that a flow of the plating solution 22 after being ejected from the nozzle 40a and hitting against the to-be-plated object 20 is returned to the first space S1 on an inflow side of the pump 70 while bending this flow downward in mid-course.

According to this configuration, the plating solution 22 after hitting against the to-be-plated object 20 flows while being bent downward in mid-course by each L-shaped flow passage 53, and is returned to the inflow side of the pump 70. For this reason, no foam is created unlike the case in which the plating solution 22 after hitting against the to-be-plated object 20 is returned to a plating solution surface side of the water tank 30. Since no foam is created, the pump 70 will no longer suck in any foam. In this way, it is possible to suppress the foam in the plating solution 22 to be circulated from the pump 70 to the nozzle 40a.

In the meantime, there is provided the setting section 50 which includes the through-hole 51a located at the position opposed to an ejection port for the plating solution 22 in the nozzle 40a, and sets the to-be-plated object 20 so as to expose the plated surface 20a of the to-be-plated object 20 the through-hole 51a toward the ejection port. The inlet of each L-shaped flow passage 53 is opened on a surrounding surface of the through-hole 51a in the setting section 50. Meanwhile, the surrounding surface of the through-hole 51a is formed into the tapered cross-sectional form 51b, which is tapered from the plated surface 20a side toward the inlet of the L-shaped flow passage 53.

According to this configuration, the plating solution 22 after hitting against the plated surface 20a immediately flows into the L-shaped flow passages 53 via the tapered cross-sectional form 51b. Hence, the foam hitting against the plated surface 20a immediately flows into the L-shaped flow passages 53 as well. As a consequence, the foam is less likely to adhere to the plated surface 20a so that the plated coating 22a can grow uniformly on the entire plated surface 20a.

Modified Example of Embodiment

Figure 4:
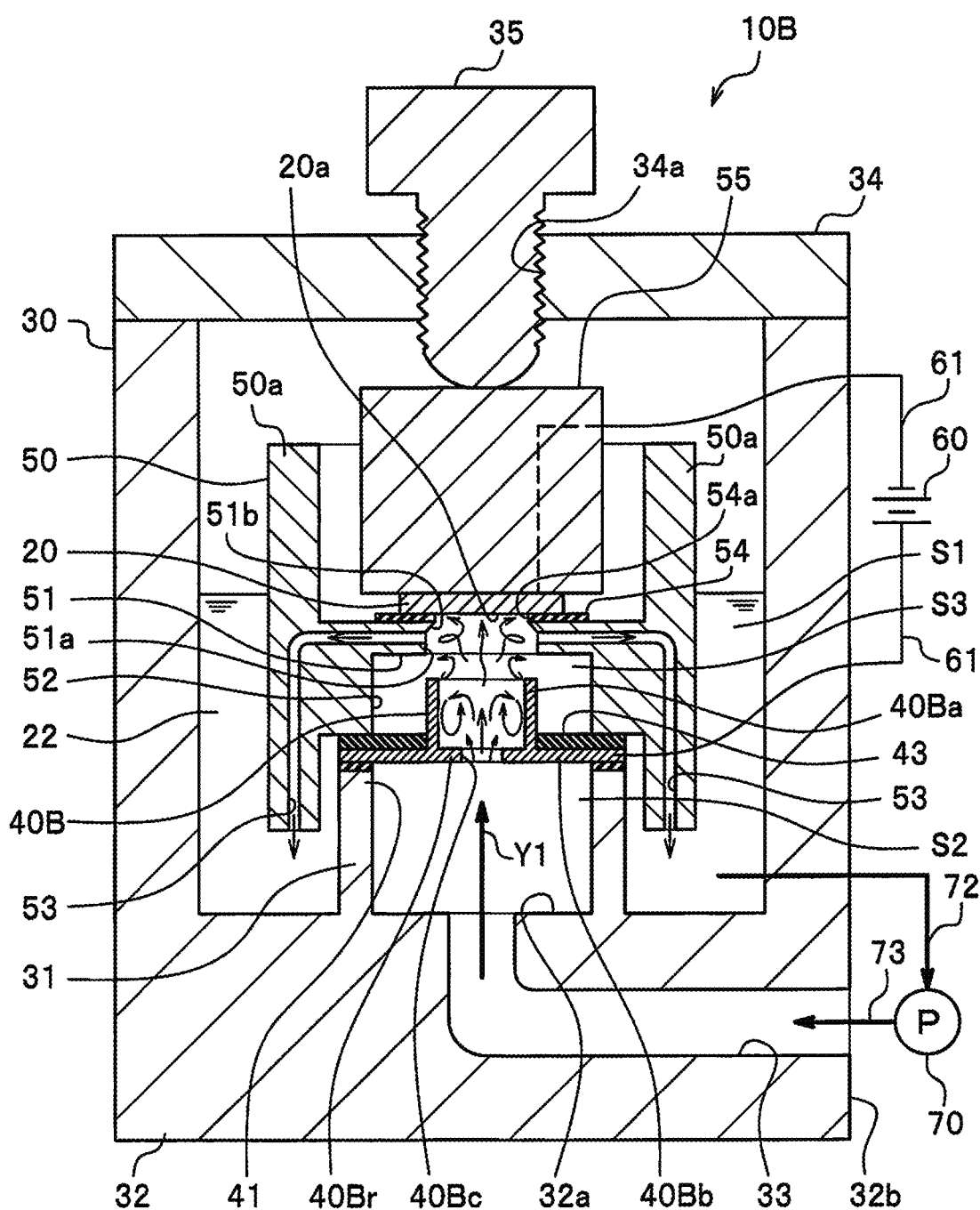
FIG. 4 is a longitudinal sectional view showing a configuration of a plating device of a modified example of the embodiment.

FIG. 4 is a longitudinal sectional view showing a configuration of a plating device of a modified example of the embodiment.

A plating device 10B of the modified example adopts the following characteristic configuration devoid of the perforated plate member 42 (FIG. 1). That is, the plating device 10B is characterized by a nozzle section 40B having a hat-like shape. The nozzle section 40B includes a nozzle 40Ba and a surrounding flat surface portion 40Bb, and an annular plate portion 40Br. The annular plate portion 40Br is provided at an opening on an inflow side of the nozzle 40B, and projects from a peripheral edge of the opening toward the center of the opening so as to form an annular shape and to be flush with the surrounding flat surface portion 40Bb.

An opening 40Bc at the center of the annular plate portion 40Br has the same size as that of the through-hole 42a in the aforementioned perforated plate member 42 (FIG. 1). The opening 40Bc only needs to have such a size that the plating solution 22 can establish a state of turbulence inside the nozzle 40Ba when the plating solution 22 passes through the opening 40Bc at a prescribed velocity. This configuration also enables the plated coating 22a to grow uniformly on the plated surface 20a of the to-be-plated object 20 as with the plating device 10 shown in FIG. 1.

Other variations and modifications may be made in accordance with the sprit and scope of the present invention.

REFERENCE SIGNS LIST 10, 10B: plating device
20: to-be-plated object
20a: plated surface
22a: plated coating
30: water tank
31: nozzle fixing section
32: bottom surface section
33: flow passage
34: lid
34a: screw hole 35: press screw
40: nozzle section
40a: nozzle
40b: surrounding flat surface portion
41: packing
42: perforated plate member
42a: through-hole
43: insulating member
50: to-be-plated object setting section
50a: square tube portion
51: partition wall portion
51a: through-hole
52: surrounding projection
53: L-shaped flow passage
54: mask member
54a: plating formation hole
55: cathode-equipped pressing portion
60: direct-current power source
70: pump

The invention claimed is:

1. A plating device comprising:
a water tank into which a plating solution is poured;
a single tubular nozzle in a cylindrical shape and having an inside diameter, the nozzle being disposed in the water tank and serving as an anode;
a to-be-plated object being disposed in the water tank so as to be opposed to the single tubular nozzle and serving as a cathode;
a direct-current power source to apply a voltage between the single tubular nozzle and the to-be-plated object; and
a pump to circulate the plating solution such that the plating solution poured into the water tank passes through the single tubular nozzle in a cylindrical shape and having an inside diameter and is directly ejected onto the to-be-plated object,
wherein the plating device further includes
an opening restricting unit to restrict an opening on an inflow side of the single tubular nozzle to a smaller diameter than the inside diameter of the single tubular nozzle, and
the opening restricting unit is formed by arranging a perforated plate member, which includes a single through-hole having a smaller diameter than the inside diameter of the single tubular nozzle, on the inflow side of the nozzle such that the through-hole is opposed to an open region of the nozzle and is formed at a central portion thereof.

2. The plating device according to claim 1, further comprising:
a bent flow passage to return the plating solution after being ejected from the nozzle and hitting against the to-be-plated object to an inflow side of the pump while bending a flow of the plating solution downward in mid-course.

3. The plating device according to claim 2, comprising:
a setting section which includes a through-hole located at a position opposed to an ejection port for the plating solution in the nozzle, and sets the to-be-plated object so as to expose a plated surface of the to-be-plated object from the through-hole toward the ejection port, wherein
the bent flow passage is formed in the setting section such that an inlet of the bent flow passage is opened on a surrounding surface of the through-hole in the setting section.

4. A plating device comprising:
a water tank into which a plating solution is poured;
a single tubular nozzle in a cylindrical shape and having an inside diameter being disposed in the water tank and serving as an anode;
a to-be-plated object being disposed in the water tank in such a way as to be opposed to the single tubular nozzle and serving as a cathode;
a direct-current power source configured to apply a voltage between the single tubular nozzle and the to-be-plated object; and
a pump configured to circulate the plating solution such that the plating solution poured into the water tank passes through the singular tubular nozzle in a cylindrical shape and having an inside diameter and is directly ejected onto the to-be-plated object,
wherein the plating device further includes
an opening restricting unit to restrict an opening on an inflow side of the single tubular nozzle in a cylindrical shape and having an inside diameter to a smaller diameter than the inside diameter of the single tubular nozzle, wherein
the opening restricting unit includes an annular plate portion provided at a center of the opening on the inflow side of the single tubular nozzle, and projects from a peripheral edge of the opening toward the center of the opening so as to form an annular shape, and
the single opening at the center and on an inner side of the annular shape has a smaller diameter than the opening of the single tubular nozzle.

5. The plating device according to claim 4, further comprising:
a bent flow passage to return the plating solution after being ejected from the nozzle and hitting against the to-be-plated object to an inflow side of the pump while bending a flow of the plating solution downward in mid-course.

6. A plating device comprising:
a water tank into which a plating solution is poured,
a single tubular nozzle in a cylindrical shape and having an inside diameter being disposed in the water tank and serving as an anode, and
a setting section to set a to-be-plated object as a cathode in the water tank so as to be opposed to the single tubular nozzle,
wherein the plating device conducts plating by applying a voltage between the single tubular nozzle and the to-be-plated object and circulates the plating solution such that the plating solution poured into the water tank passes through the single tubular nozzle and is directly ejected onto the to-be-plated object, and
wherein the plating device further includes
an opening restricting unit to restrict an opening on an inflow side of the single tubular nozzle to a smaller diameter than an inside diameter of the single tubular nozzle.

7. The plating device according to claim 6,
wherein the opening restricting unit is formed by arranging a perforated plate member, which includes a through-hole having a smaller diameter than the inside diameter of the nozzle, on the inflow side of the nozzle such that the through-hole is opposed to an open region of the nozzle and is formed at a central portion thereof.

8. The plating device according to claim 6,
wherein the opening restricting unit includes an annular plate portion provided at the opening on the inflow side of the nozzle, and projects from a peripheral edge of the opening toward the center of the opening so as to form an annular shape, and wherein an opening on an inner side of the annular shape has a smaller diameter than the opening of the nozzle.

* * * * *